(12) United States Patent
Distefano et al.

(10) Patent No.: US 6,196,042 B1
(45) Date of Patent: Mar. 6, 2001

(54) COINING TOOL AND PROCESS OF MANUFACTURING SAME FOR MAKING CONNECTION COMPONENTS

(75) Inventors: Thomas H. Distefano, Monte Sereno; Joseph Fjelstad, Sunnyvale; Belgacem Haba, Cupertino, all of CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/281,643

(22) Filed: Mar. 31, 1999

Related U.S. Application Data
(60) Provisional application No. 60/080,519, filed on Apr. 3, 1998.

(51) Int. Cl.$^7$ .................................................. B21D 28/10
(52) U.S. Cl. ................................ 72/325; 112/412; 29/827; 76/107.1
(58) Field of Search ............................. 72/326, 325, 412; 413/12, 15, 17, 67; 76/107.1; 83/879, 880; 29/827

(56) References Cited

U.S. PATENT DOCUMENTS

| | | | |
|---|---|---|---|
| 3,470,773 | * | 10/1969 | Mueller .............................. 76/107.1 |
| 3,728,980 | * | 4/1973 | Fraze .................................... 72/325 |
| 3,970,023 | * | 7/1976 | Herbst .................................. 72/325 |
| 4,012,935 | * | 3/1977 | Holk .................................... 72/325 |
| 4,105,134 | * | 8/1978 | Debenham ......................... 220/268 |
| 4,122,791 | * | 10/1978 | Brown ................................. 83/880 |
| 4,192,244 | * | 3/1980 | Kelley ................................. 413/17 |
| 4,341,303 | * | 7/1982 | Britt ................................... 206/82 |
| 4,579,022 | * | 4/1986 | Kasai ................................ 76/107.1 |
| 5,148,265 | | 9/1992 | Khandros et al. .................... 357/80 |
| 5,148,266 | | 9/1992 | Kahndros et al. ................... 357/80 |
| 5,177,326 | * | 1/1993 | Goldhammer ....................... 29/874 |
| 5,489,749 | | 2/1996 | Distefano et al. .................. 174/261 |
| 5,491,302 | | 2/1996 | Distefano et al. .................. 114/260 |
| 5,518,964 | | 5/1996 | Distefano et al. .................. 437/209 |
| 5,629,239 | | 5/1997 | Distefano et al. ................... 216/14 |
| 5,938,390 | * | 8/1999 | Jordan ................................. 413/12 |

FOREIGN PATENT DOCUMENTS

WO 94/03036   2/1994   (WO) .

* cited by examiner

*Primary Examiner*—Daniel C. Crane
(74) *Attorney, Agent, or Firm*—Lerner, David, Littenberg, Krumholz & Mentlik, LLP

(57) ABSTRACT

A tool having a coining projection is operative for forming a frangible portion in a lead of a microelectronic connection component by application of a compressive force. The coining projection is supported on a pedestal formed from a tool body. In an alternative embodiment, the pedestal is formed on a backing plate for use in circuits up construction. The pedestal is sized and shaped so as to be received within a gap formed in a support layer for the leads. By application of the compressive force, the coining projection will penetrate the lead within the region of the gap to form the frangible portion.

79 Claims, 3 Drawing Sheets

COINING TOOL AND PROCESS OF MANUFACTURING SAME FOR MAKING CONNECTION COMPONENTS

The present application claims the benefit of U.S. Provisional patent application No. 60/080,519 filed on Apr. 3, 1998, the disclosure of which is hereby incorporated by reference herein.

The present invention relates in general to the field of microelectronic connection components, and more particularly, to coining tools and to methods of making coining tools for use in manufacturing microelectronic connection components.

Connection components for microelectronic devices, such as semiconductor chips, form electrical connections between the microelectronic device and external circuitry or other microelectronic devices. These connection components commonly incorporate conductive elements such as fine metallic leads and terminal structures disposed on a dielectric layer such as a polymeric layer. In conventional tape automated bonding ("TAB"), a prefabricated array of leads is provided on a flexible dielectric tape. The leads are bonded to contacts on the microelectronic device. The connection components illustrated in U.S. Pat. Nos. 5,489,749; 5,518,964; 5,148,265; 5,148,266; 5,491,302; and International Publication WO 94/03036, the disclosures of which are hereby incorporated by reference herein, also incorporate leads and other electrically conductive elements. Leads for use with modern semiconductor chips having large numbers of closely-spaced contacts must be very fine. They may be, for example, about 15 to about 40 microns wide. These leads must be provided in precise locations on the connection component.

The metallic elements in these and other components have been fabricated by various processes, most commonly by photochemical processes. In one photochemical process, patternwise etching of a metallic layer is utilized to form the leads. A photographically patterned etch resist is used to selectively etch unwanted portions of the metal layer so that the resist-protected portions form the leads of the connection component. In another method, a metal is plated in areas defined by a photographically patterned resist.

Photochemical processes suffer significant drawbacks in that they require several steps. The resist must be exposed to illumination in the desired pattern, typically by use of a mask. The resist is thereby developed so as to cure only the resist in exposed areas or only the resist in the unexposed areas. The uncured resist is then removed, leaving a mask which has openings in areas where metal is to be removed or added. After etching or plating, the cured resist forming the mask is then removed. These steps entail significant cost and limit the speed of fabrication. In addition, photochemical processes typically cannot form features smaller than a certain size. This size depends on the type of resist used and the developing process.

Conventional stamping processes have been used to fabricate relatively large metallic elements such as large leads for lead frame packaging, such as lead-in surface mount packages, e.g., TSOP or QFP. In a simple stamping process, a sheet of metal is passed between a pair of matched tools referred to as a punch and a die. The punch has a protrusion corresponding to the shape of the part to be formed, whereas the die has a hole precisely matched to the shape of the punch, and just slightly larger than the punch. As the tools are forced together, the punch enters the hole in the die and shears a portion of the metal sheet corresponding in shape to the punch from the remainder of the sheet. Stamping processes can be performed rapidly. Although stamping processes can be used to form relatively large, coarse parts, it is typically not practical to stamp very fine leads for use with microelectronic connection components having closely spaced contacts.

Despite the substantial time and effort expended to solve the problems associated with fabrication of leads and features thereof for connection components and other metallic parts, further improvement in such processes would be desirable. Improved processes for fabricating metallic parts such as the leads of connection components using a die are disclosed in copending prior U.S. patent application filed Dec. 12, 1997, application Ser. No. 08/989,587, 6,053,837 entitled Fabrication of Components by Coining naming Marcus Millet as the inventor, which patent is incorporated herein by reference. The '837 patent discloses a method of fabricating leads of a connection component for connecting a microelectronic element such as taught in U.S. Pat. No. 5,629,239, the disclosure of which is incorporated herein by reference.

The leads are formed to include frangible portions using a die and backing element in an embossing process commonly referred to as "coining". The die includes recessed portions including lead-forming portions of a constant depth, interrupted by frangible element forming portions. The frangible element forming portions are recessed to a lesser depth relative to the die surface than the lead-forming portions. The die also includes bus-forming portions, and terminal-forming portions of the same depth as the lead-forming portion. The die is used with a planar backing element. The forming process yields a lead structure including lead portions having a thickness substantially greater than the frangible portions which interrupt each lead portion. After forming, the leads are provided with a supporting dielectric layer overlying one surface thereof. The dielectric layer is then etched to form an opening, as by laser ablation, leaving the leads projecting across the opening, each having a frangible portion. The metallic lead structures thus formed can be plated with a bondable material such as gold over a barrier layer. These leads can be connected to a microelectronic component in the manner discussed in WO 94/03036. As each lead is bent downwardly, each lead is broken at the frangible portion.

Accordingly, it can be appreciated that there is a need for further improvements in the manufacturing of microelectronic connection components, and particularly, in the formation of leads having frangible portions by use of a coining tool.

SUMMARY OF THE INVENTION

In accordance with the present invention, an embossing or coining tool and process of manufacturing same is disclosed for use in making connection components having frangible leads for connection to microelectronic components. One of the limiting factors in manufacturing microelectronic components is the stringent requirements for fabrication of the frangible portion of the leads. The very small features required of the frangible portion, e.g., about 12 microns, is typically beyond the manufacturing capabilities for most otherwise capable manufacturers. One way to ameliorate this problem is to remove the requirement for fabricating the frangible portion in the lead using photolithographic techniques. To accomplish this, an embossing or coining tool is proposed in accordance with the present invention. The tool would mechanically notch the metal lead in forming the frangible portion by means of a coining projection. The depth of the notch is controlled by an etching process used during the manufacturing process for the tool profile, where the etch depth for the tool is approximately ½ the thickness of the lead being notched. The tool is produced from the same data used to create the tape artwork and contains all necessary tool features required for good registration. A second element of the tool is the formation of a pedestal supporting the coining projection which may be required for "circuits up" constructions. In this regard, it is envisaged that the notch will preferably be on the side opposite the bonding tool to assure a clean break of the lead at the frangible portion formed by the notch. However, the notch forming the frangible portion can also be formed in the top surface of the lead which is engaged by the bonding tool by using a backing plate provided with the coining projection.

The present invention can be employed to form frangible portions in various lead configurations, including conventional tape automated bonding leads and those depicted in U.S. Pat. Nos. 5,489,749; 5,491,302; 5,629,239; and 5,518,964, the disclosures of which are hereby incorporated by reference herein. As discussed in these patents, the leads can be provided on dielectric layers such that the leads extend into or across gaps in the dielectric layers and so that the leads can be bent downwardly towards contacts on the surface, to form a bent configuration. The invention can also be employed in leads which include a polymer layer. Preferably, the polymer layer is absent in the bond region, or in a part of the bond region engaged by the bonding tool, to permit efficient energy coupling between the tool and the bond interface. Combined metal and polymer lead structures are shown in the above-mentioned U.S. Pat. No. 5,489,749.

In accordance with one embodiment of the present invention there is described a tool for use in making a connection component including at least one lead having a frangible portion, the tool comprising a base, at least one pedestal on the base, and at least one projection overlying said pedestal, the projection conforming to the configuration of the frangible portion.

In accordance with another embodiment of the present invention there is described a tool for use in making a connection component including at least one lead having a frangible portion, the connection component including a dielectric support layer having an opening spanned by at least one lead, the tool comprising a base, at least one pedestal on the base, the pedestal receivable within the opening within the dielectric support layer, and at least one projection overlying the pedestal, the projection conforming to the configuration of the frangible portion, wherein the height of the pedestal above the base is approximately equal to the thickness of the dielectric support material.

In accordance with another embodiment of the present invention there is described a tool for use in making a connection component including at least one lead having a frangible portion, the tool comprising a base, at least one pedestal on the base, a backing plate having a surface opposing the pedestal, and at least one projection on the backing plate conforming to the configuration of the frangible portion.

In accordance with another embodiment of the present invention there is described a method of making a tool for use in making a connection component including at least one lead having a frangible portion, the method comprising the steps of providing a tool body or backing plate, forming on the tool body at least one pedestal, and forming on a surface of the pedestal or the backing plate at least one projection, the projection conforming to the configuration of the frangible portion.

BRIEF DESCRIPTION OF THE DRAWINGS

The above description, as well as further objects, features and advantages of the present invention will be more fully understood with reference to the following detailed description of a coining tool and process of manufacturing same for making connection components, when taken in conjunction with the accompanying drawings, wherein.

DETAILED DESCRIPTION OF THE PREFERRED EMBODIMENTS

Figure 1:
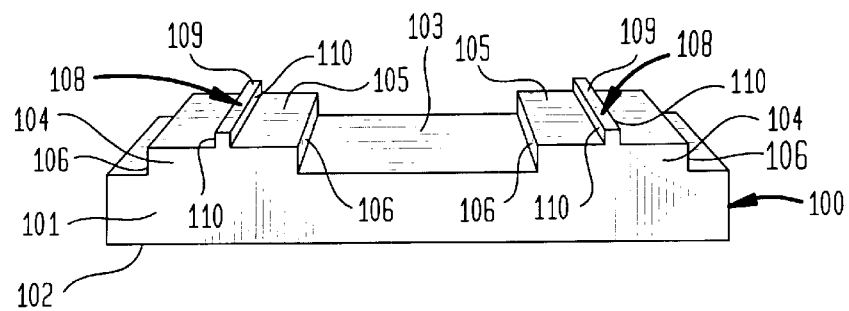
FIG. 1 is a perspective view of a coining tool constructed in accordance with one embodiment of the present invention.

Referring now to the drawings, wherein like reference numerals represent like elements, there is shown in FIG. 1, a tool 100 formed from a tool body 101 which includes a planar bottom surface 102 and a planar top surface 103 from which there upwardly extends a pair of spaced apart pedestals 104. The pedestals 104 are shown, by way of example only, as elongated rectangular members having a planar top surface 105 and vertical sidewalls 106. A pair of spaced apart coining projections 108 project upwardly from the top surface 105 of each of the pedestals 104. As shown, the coining projections 108 are generally arranged having their longitudinal axis parallel to one another within a common horizontal plane. Preferably, the plane containing the coining projections 108 is parallel to the plane of the top and bottom surfaces 102, 103 of the tool 100. By way of one example only, the coining projections 108 are shown as one continuous elongated rectangular member having a planar top surface 109 and vertical sidewalls 110. However, other shapes such as triangular, polygonal, trapezoidal, rounded or the like, as well as longitudinally segmented or separated plural projections may be employed.

The tool 100 can be constructed from a variety of materials, particularly those having a certain degree of hardness and corrosion resistance. For example, those metal materials known as stainless steel are particularly suitable. However, it should be understood that other metals which may be chemically etched or mechanically ablated are also suitable for use in fabricating the tool. In addition, the tool 100 may be constructed as a composite of different materials, for example, a stainless steel base having a copper outer layer formed by plating, laminating or other suitable such means.

Figure 2:
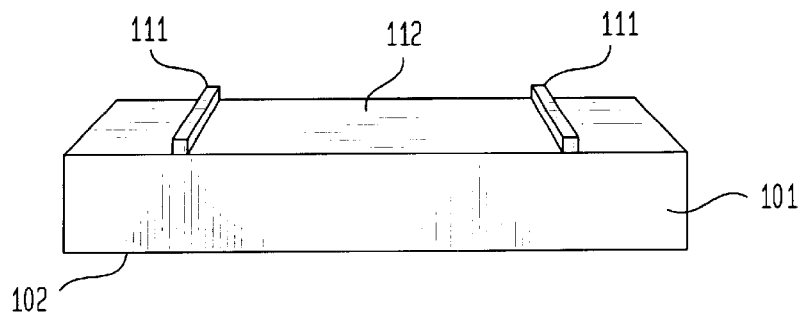
FIGS. 2–5 are sequential perspective views showing various stages in a process of manufacturing the aforementioned coining tool in accordance with one embodiment of the present invention.
Figure 3:
Figure 4:
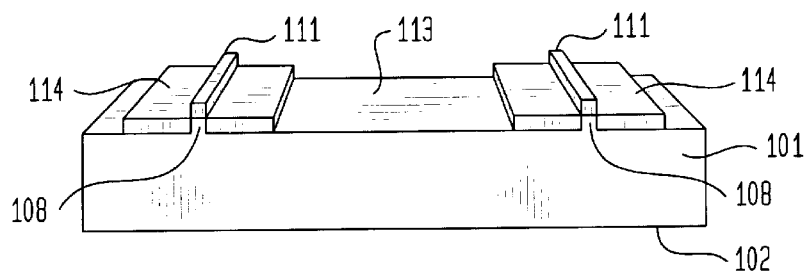
Figure 5:
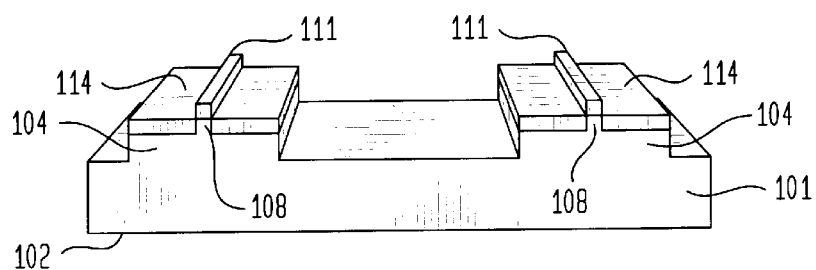

Referring to FIG. 2, the tool body 101 is masked and patterned to define the location and configuration of the coining projections 108 desired. Any suitable masking process may be used, for example, photolithographic techniques which employ a mask 111 of polymer material such as photoresist and the like. The exposed top surface 112 of the tool body 101 is etched or otherwise ablated to a depth of approximately 12 microns to define the coining projections 108 as shown in FIG. 3. As shown in FIG. 4, the exposed upper surface 113 of the tool body 101 is recoated with photoresist to form a mask 114 which is patterned to define the configuration of the pedestals 104. The upper surface 113 of the tool body 111 is once again etched or ablated a second time to create the spaced apart pedestals 104 from which the coining projections 108 extend upwardly as shown in FIG. 5.

The tool, as shown in FIG. 1, is completed by stripping the residual photoresist masks 111, 114 using conventional techniques such as chemical or plasma removal processes. The tool 100 has thus far been described as being manufactured using conventional photolithographic techniques using photoresist and chemical etching or ablation. However, it is to be understood that other conventional techniques such as grinding, coining, stamping and the like may be used to create the coining projections 108 which are supported on the pedestals 104.

The tool 100 as noted can be constructed from a single material from which the coining projections 108 and pedestals 104 can be formed using the aforementioned processes. In an alternative embodiment, the pedestals 104 and coining projections 108 can be formed from a copper or ceramic layer which has been deposited onto the tool body 101. In this regard, a copper or ceramic layer is initially plated, bonded, or otherwise formed on the top surface of a metal tool body of, for example, stainless steel material. The copper or ceramic layer is subsequently masked and etched as noted hereinabove to create the coining projections 108 and pedestals 104. In still a further embodiment, it is preferred that the coining projections 108 be constructed from relatively harder material than the material of the leads into which the frangible portions are to be fabricated during use of the tool loo. By way of example, the coining projections 108 can be formed from hard materials such as rhodium or osmium. In addition, it is contemplated that the coining projections 108 can be formed from the former materials and provided with a coating of a hard material such as rhodium or osmium or the like. To this end, a layer of such material may be initially deposited onto the surface of the tool body at the time of constructing the projections 108 such as shown in FIG. 2. Alternatively, the pedestals 104 can be formed on the tool body 101 initially without any coining projections. The coining projections 108 can subsequently be formed on the pedestals 104 after the process step disclosed in FIG. 5 using, once again, suitable masking and photolithographic techniques.

Further, the tool body 101 can be provided with a layer of aluminum which can be easily etched to form the pedestal 104 and coining projections 108. Subsequently, the aluminum layer can be hard anodized to provide a hard surface. To prevent possible loading of the tool 100 with the lead forming material during use, the face of the tool 100 can be coated with a thin layer of PTFE which also prevents any sticking or friction related problems.

Figure 6:
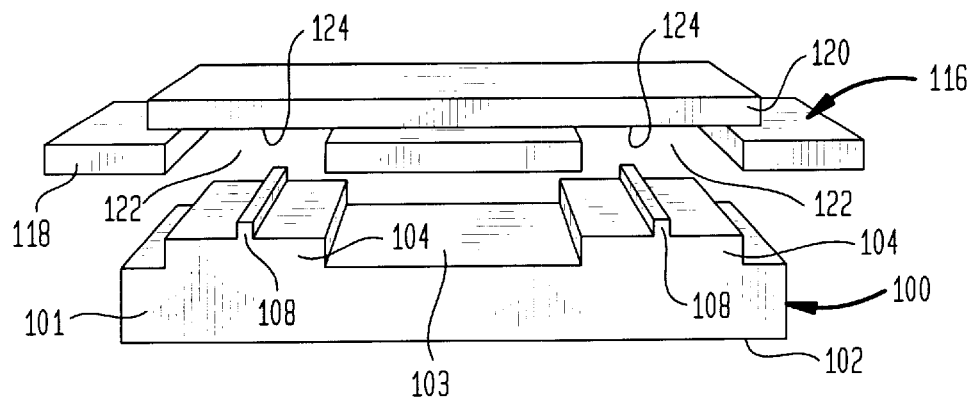
FIGS. 6–8 are sequential perspective views showing various stages in the fabrication of a microelectronic connection component using the aforesaid coining tool.

Use of the tool 100 in forming frangible portions in the leads of a connection component will now be described with respect to FIGS. 6–8. The connection component 116 may be of the type disclosed in U.S. Pat. No. 5,629,239. The connection component 116 includes a continuous dielectric support layer 118, e.g., a sheet of polyimide material, supporting a layer of lead forming material 120. openings 122 are formed within the dielectric support layer 118 so as to expose portions of the lead forming material 120 as shown in FIG. 6. The openings 122 are thus formed in the areas of the leads where the frangible portions are to be formed.

Figure 7:
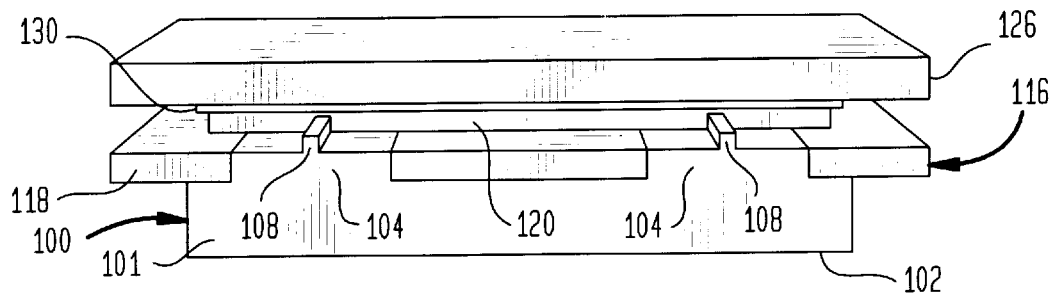
Figure 8:
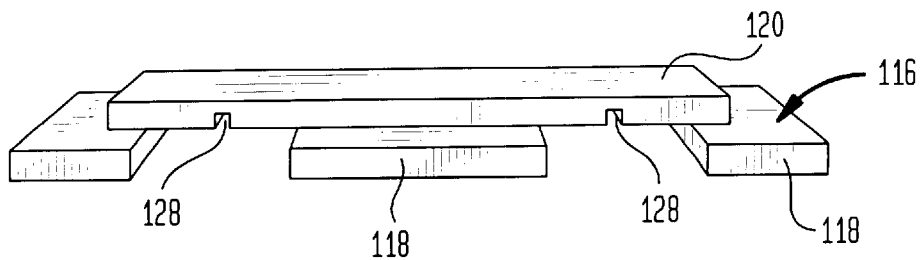

As shown in FIG. 7, the tool 100 is brought into operative association with the connection component 116. Specifically, the pedestals 104 are shaped and sized so as to be received within the openings 122 within the dielectric support layer 118. This positions the coining projections 108 underlying the bottom surface 124 of the lead forming material 120 at a registered location for forming the frangible portions. By shaping and sizing the pedestals 104 to conform in close tolerance to the shape and size of the openings 122, accurate positioning and registration of the frangible portions for each lead of the connection component can be achieved.

To facilitate the application of sufficient pressure or force on the tool 100 to emboss or coin the frangible portions into the lead forming material 120 via the coining projections 108, a backing plate 126 may be used. The backing plate 126 is typically a hard metal plate which is positioned abutting the surface of the lead forming material 120 so as to enable application of sufficient force to the lead forming material by the tool 100. The tool 100 will accordingly form frangible portions in the lead forming material 120 whose configuration and dimensions conform to those of the coining projections 108. As shown in FIG. 8, the frangible portions 128 are in the form of a rectangular opening formed within the lead forming material 120 which conform to the shape of the coining projections 108.

When using the backing plate 126, it may be desirable to include a pad of hard yieldable material 130 interposed between the backing plate and the top surface of the lead forming material 120. The pad 130, pursuant to one example, may have a thickness of about 2 mls. The pad 130 may be constructed of such materials which although hard, have sufficient elasticity or pliability, for example hard rubber or urethane material, to act as a counter-die for the coining projections 108. In this regard, as the coining projections 108 are stamped into the lead forming material 120, the opposing portion of the lead forming material will have a certain degree of compliancy via the pad 130 so as to enable the coining projections to penetrate the lead forming material to their complete depth. This ensures that the resulting frangible portions 128 will have dimensions conforming substantially to the coining projections 108.

The lead forming material 120 may be subsequently divided into individual leads of the connection component 116 using suitable masking and photolithographic techniques. As such, the frangible portions 128 are formed for all the leads contemporaneously in the single layer of lead forming material 120. However, it is also contemplated that the lead forming material 120 may be initially separated into the individual leads prior to forming the frangible portions 128. The leads may have a width of approximately 16 microns formed from a copper substrate. As is conventionally known, the leads may have a gold layer of approximately 1–2 microns plated over the surfaces of the leads.

In use of the tool 100, it is also contemplated to support the tool by one or more belleville washers which are operative for accommodating any non-planarity of the press platen used during the embossing or coining operation. Any other suitable elements for accommodating for possible non-planarity may be used as well.

Figure 9:
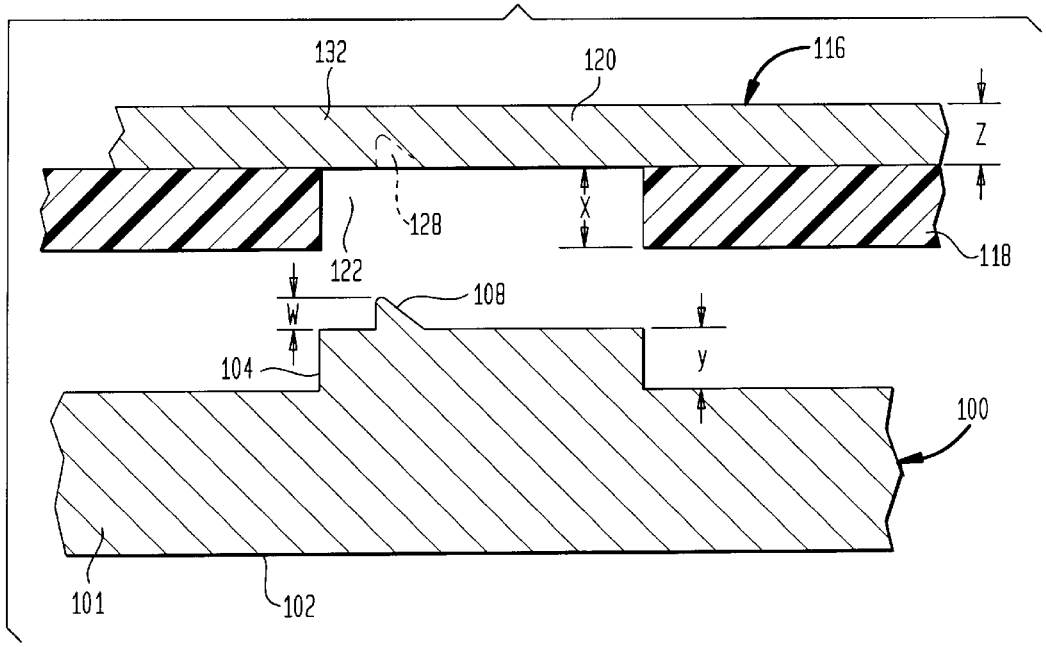
FIG. 9 is a front elevational view of a coining tool constructed in accordance with one embodiment of the present invention in operative relationship with a connection component for forming a frangible lead therein.

Referring to FIG. 9, the height "Y" of the pedestal 104 should preferably be approximately equal to or slightly less than the thickness "X" of the dielectric support layer 118. As the dielectric support layer 118 has a certain amount of resiliency, this will accommodate slight dimension differences. This will ensure that the full extent of the coining projection 108 will penetrate into the lead forming material 120. This will further ensure that the depth of the frangible portion 128 formed within the lead forming material 120 will correspond to the dimensions and configuration of the coining projection 108, see dashed lines. The pedestal 104 will also provide desirable support for the lead forming material 120 within the openings 122. This will prevent damage to the lead forming material 120 when being compressed against the backing plate 126 by the tool 100. As further shown, the height "W" of the projections 108 is less than the thickness "Z" of the lead forming material 130, so long as "X" is greater than "Y". This results in the lead forming material 130 having a relatively thin portion 132 thereof in the area of the frangible portion 128.

Figure 10:
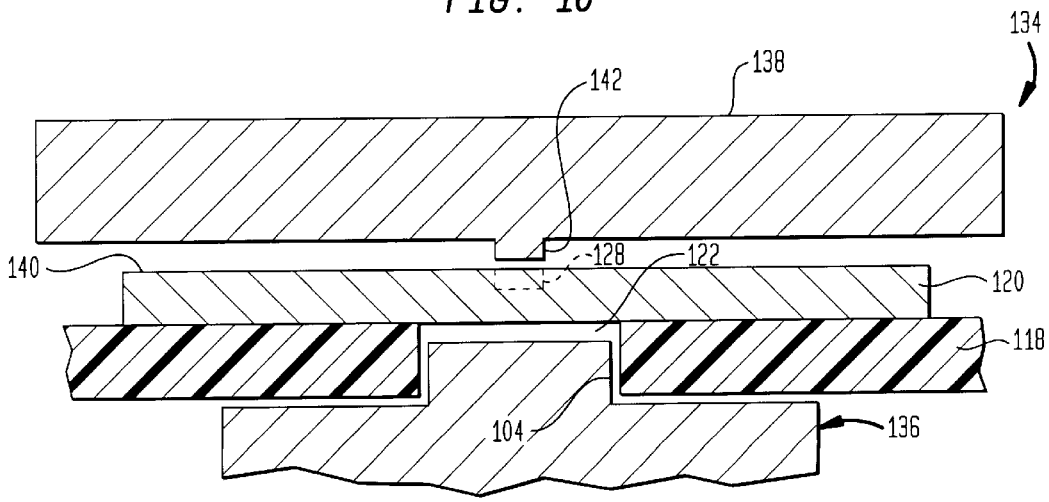
FIG. 10 is a front elevational view showing the construction of a tool in accordance with another embodiment of the present invention including a backing plate supporting the coining projection.

Referring to FIG. 10, there is shown a tool 134 in accordance with another embodiment of the present invention including a base 136 and backing plate 138 operative for forming the frangible portion 128 in the top surface 140 of the lead forming material 120, i.e., circuits up construction. That is, the frangible portion 128 is formed in the surface 140 on the same side of the lead forming material 120 which is engaged by the bonding tool during the bonding operation. Specifically, the base 136 is formed to include a pedestal 104 as thus far described. However, the pedestal 104 does not support the coining projection 142. In this regard, the backing plate 138 is formed with a coining projection 142 in the manner as previously described, for example, using photolithographic techniques. As such, the coining projection 142 can be constructed of the same materials as previously noted with respect to coining projection 108. Similarly, the base 136 and pedestal 104 may be formed of the same materials as previously described. In use, the backing plate 138 and the base 136 will be aligned with respect to each other typically by the platens of a press so as to register the coining projection 142 in proper registration with the lead forming material 120 overlying the opening 122 in the dielectric support layer 118.

The coining projections 108, 142 shown in FIGS. 1–8 and 10 have a generally rectangular shape. On the other hand, the coining projection 108 illustrated in FIG. 9 has a triangular shape or trapezoidal shape. The triangular shape facilitates penetration of the lead forming material 120 in creating the frangible portion 128. It is, however, contemplated that other shaped coining projections 108 may be employed pursuant to the present invention.

The tool 100, 134 of the present invention may be used for forming the frangible portions 128 within microelectronic connection components 116. Preferably, the tool will be constructed to include an array of coining projections 108, 142, each array corresponding to a single connection component 116. The plurality of arrays will be arranged in a matrix to be registerable with a plurality of connection components 116 on a single flexible tape. For example, a flexible tape containing 30 connection components, each having 46 leads per component, can be processed at a single time with a single tool 100, 134 constructed in accordance with the present invention. This will result in the simultaneous formation of 1380 frangible portions 128 within the leads of the connection components 116.

Although the invention herein has been described with reference to particular embodiments, it is to be understood that the embodiments are merely illustrative of the principles and application of the present invention. It is therefore to be understood that numerous modifications may be made to the embodiments and that other arrangements may be devised without departing from the spirit and scope of the present invention as defined by the claims.

What is claimed is:

1. A tool for use in making a connection component including at least one lead having a frangible portion, said tool comprising a base, a plurality of pedestals on said base, and at least one projection overlying each said pedestal, at least one said projection conforming to the configuration of said frangible portion.

2. The tool of claim 1, wherein said pedestals are arranged in an array.

3. The tool of claim 1, wherein at least one of said pedestals and at least one of said projections are formed of the same material.

4. The tool of claim 1, wherein said projections are formed from a material harder than a material forming said pedestals.

5. The tool of claim 1, wherein at least one of said projections is provided on one of said pedestals.

6. The tool of claim 1, further including a backing plate having a surface opposing at least one of said pedestals, at least one of said projections provided on said surface of said backing plate.

7. The tool of claim 1, further including a layer of PTFE covering at least one of said projections.

8. The tool of claim 1, wherein at least one of said projections has a height less than a thickness of said lead.

9. The tool of claim 1, wherein said connection component includes a support layer supporting said at least one lead, and wherein at least one of said pedestals has a height approximately equal to or less than a thickness of said support layer.

10. The tool of claim 1, wherein said base has a bottom surface and at least one of said pedestals has a top surface parallel to said bottom surface.

11. A tool for use in making a connection component including at least one lead having a frangible portion, said connection component including a dielectric support layer having an opening spanned by said at least one lead, said tool comprising a base, at least one pedestal on said base, said pedestal receivable within said opening within said dielectric support layer, and at least one projection overlying said pedestal, said projection conforming to the configuration of said frangible portion, wherein the height of said pedestal above said base is approximately equal to the thickness of said dielectric support material.

12. The tool of claim 11, further including a plurality of said pedestals and at least one projection overlying each of said pedestals.

13. The tool of claim 11, wherein said projection is formed from a material harder than a material forming said pedestal.

14. The tool of claim 13, wherein said projection is constructed of material selected from the group consisting of osmium, rhodium, ceramic material and hard anodized aluminum.

15. The tool of claim 11, wherein said projection is provided on said pedestal.

16. The tool of claim 11, further including a backing plate having a surface opposing said pedestal, said projection provided on said surface of said backing plate.

17. The tool of claim 11, further including a layer of PTFE covering at least said projection.

18. The tool of claim 11, wherein said projection has a height less than a thickness of said lead.

19. The tool of claim 11, further including a backing plate opposing said lead and a yieldable pad between said backing plate and said lead.

20. The tool of claim 11, wherein said base has a bottom surface and said pedestal has a top surface parallel to said bottom surface.

21. A method of making a connection component comprising providing a tool in accordance with claim 11, and engaging said projection against one surface of said lead under compression for forming said frangible portion therein.

22. The method of claim 21, further including the step of providing a backing plate against another surface of said lead.

23. The method of claim 22, further including the step of disposing a pad between said backing plate and said another surface of said lead.

24. The method of claim 22, wherein said projection is provided on said backing plate.

25. The method of claim 21, wherein said projection is provided on said pedestal.

26. The method of claim 21, wherein said projection has a height less than a thickness of said lead.

27. The method of claim 21, further including supporting said base by a yieldable member.

28. The method of claim 21, wherein said base has a bottom surface and said pedestal has a top surface parallel to said bottom surface.

29. A tool for use in making a connection component including at least one lead having a frangible portion, said tool comprising a base, at least one pedestal having a planar surface on said only base, a backing plate having a surface opposing said pedestal, and at least one projection on said backing plate conforming to the configuration of said frangible portion.

30. The tool of claim 29, wherein said pedestal and said projection are formed of the same material.

31. The tool of claim 29, wherein said projection is formed from a material harder than a material forming said pedestal.

32. The tool of claim 29, wherein said projection has a height less than a thickness of said lead.

33. The tool of claim 29, wherein said connection component includes a support layer supporting said at least one lead, and wherein said pedestal has a height approximately equal to a thickness of said support layer.

34. The tool of claim 29, wherein said base has a bottom surface and said pedestal has a top surface parallel to said bottom surface.

35. A method of making a connection component comprising providing a tool in accordance with claim 29, and engaging said projection against one surface of said lead under compression for forming said frangible portion thereof.

36. The method of claim 35, further including the step of disposing a pad between said backing plate and said another surface of said lead.

37. The method of claim 35, wherein said projection has a height less than a thickness of said lead.

38. The method of claim 35, wherein said connection component includes a support layer supporting said at least one lead, and wherein said pedestal has a height approximately equal to a thickness of said support layer.

39. The method of claim 35, wherein said base has a bottom surface and said pedestal has a top surface parallel to said bottom surface.

40. A method of making a connection component including at least one lead having a frangible portion, said method comprising providing a tool including a base, at least one pedestal on said base, and at least one projection overlying said pedestal, said projection conforminq to the configuration of said frangible portion; engaging said projection against one surface of said lead under compression for forming said frangible portion therein; providing a backing plate against another surface of said lead; and disposing a pad between said backing plate and said another surface of said lead.

41. The method of claim 40, wherein said projection is provided on said backing plate.

42. The method of claim 40, wherein said projection is provided on said pedestal.

43. The method of claim 40, wherein said projection has a height less than a thickness of said lead.

44. The method of claim 40, wherein said connection component includes a support layer supporting said at least one lead, and wherein said pedestal has a height approximately equal to or less than a thickness of said support layer.

45. The method of claim 40, wherein said base has a bottom surface and said pedestal has a top surface parallel to said bottom surface.

46. A method of making a tool for use in making a connection component including at least one lead having a frangible portion, said method comprising the steps of providing a tool body, forming on said tool body at least one pedestal, and forming on a surface of said pedestal at least one projection, said projection conforming to the configuration of said frangible portion, wherein said projection is formed from a material harder than a material forming said pedestal.

47. The method of claim 46, wherein said projection is constructed of material selected from the group consisting of osmium, rhodium, ceramic material and hard anodized aluminum.

48. The method of clam 46, wherein said tool body is formed from a material different from said pedestal and said projection.

49. The method of claim 46, further including the step of applying a layer of PTFE over at least said projection.

50. The method of claim 46, wherein said connection component includes a support layer supporting said at least one lead, and wherein said pedestal has a height approximately equal to or less than a thickness of said support layer.

51. A tool made in accordance with the method of claim 46.

52. A tool for use in making a connection component including at least one lead having a frangible portion, said tool comprising a base, at least one pedestal on said base, and at least one projection overlying said pedestal, said projection conforming to the configuration of said frangible portion, wherein said projection is formed from a material harder than a material forming said pedestal.

53. The tool of claim 52, wherein said projection is provided on said pedestal.

54. The tool of claim 52, further including a backing plate having a surface opposing said pedestal, said projection provided on said surface of said backing plate.

55. The tool of claim 52, wherein said base has a bottom surface and said pedestal has a top surface parallel to said bottom surface.

56. A tool for use in making a connection component including at least one lead having a frangible portion, said tool comprising a base, at least one pedestal on said base, at least one projection overlying said pedestal, said projection conforming to the configuration of said frangible portion, and a layer of PTFE covering at least said projection.

57. The tool of claim 56, wherein said projection is provided on said pedestal.

58. The tool of claim 56, further including a backing plate having a surface opposing said pedestal, said projection provided on said surface of said backing plate.

59. A tool for use in making a connection component including at least one lead having a frangible portion and a support layer supporting said at least one lead, said tool comprising a base, at least one pedestal on said base, and at least one projection overlying said pedestal, said projection conforming to the configuration of said frangible portion, wherein said pedestal has a height approximately equal to or less than a thickness of said support layer.

60. The tool of claim 59, wherein said projection is provided on said pedestal.

61. The tool of claim 59, further including a backing plate having a surface opposing said pedestal, said projection provided on said surface of said backing plate.

62. A method of making a connection component including at least one lead having a frangible portion and a support layer supporting said at least one lead, said method comprising providing a tool including a base, at least one pedestal on said base, said pedestal having a height approximately equal to or less than a thickness of said support layer, and at least one projection overlying said pedestal, said projection conforming to the configuration of said frangible portion; and engaging said projection against one surface of said lead under compression for forming said frangible portion therein.

63. The method of claim 62, further including the step of providing a backing plate against another surface of said lead.

64. The method of claim 63, wherein said projection is provided on said backing plate.

65. The method of claim 62, wherein said projection is provided on said pedestal.

66. A tool for use in making a connection component including at least one lead having a frangible portion, said tool comprising a base, at least one pedestal on said base, a backing plate having a surface opposing said pedestal, and at least one projection on said backing plate conforming to the configuration of said frangible portion, wherein said projection is formed from a material harder than a material forming said pedestal.

67. A method of making a tool for use in making a connection component including at least one lead having a frangible portion, said method comprising the steps of providing a tool body, forming on said tool body at least one pedestal, and forming on a surface of said pedestal at least one projection, said projection conforming to the configuration of said frangible portion, wherein said tool body is formed from a material different from said pedestal and said projection.

68. The method of claim 67, wherein said projection is constructed of material selected from the group consisting of osmium, rhodium, ceramic material and hard anodized aluminum.

69. A method of making a tool for use in making a connection component including at least one lead having a frangible portion, said method comprising the steps of providing a tool body, forming on said tool body at least one pedestal, forming on a surface of said pedestal at least one projection, said projection conforming to the configuration of said frangible portion, and applying a layer of PTFE over at least said projection.

70. A method of making a tool for use in making a connection component including at least one lead having a frangible portion, said method comprising the steps of providing a tool body, forming on said tool body at least one pedestal, and forming on a surface of said pedestal at least one projection, said projection conforming to the configuration of said frangible portion, wherein said connection component includes a support layer supporting said at least one lead, and wherein said pedestal has a height approximately equal to or less than a thickness of said support layer.

71. A method of making a tool for use in making a connection component including at least one lead having a frangible portion, said method comprising the steps of providing a tool body and a backing plate, forming on said tool body at least one pedestal, and forming on a surface of said backing plate at least one projection, said projection conforming to the configuration of said frangible portion, wherein said projection is formed from a material harder than a material forming said pedestal.

72. The method of claim 71, wherein said projection is constructed of material selected from the group consisting of osmium, rhodium, ceramic material and hard anodized aluminum.

73. The method of clam 71, wherein said tool body is formed from a material different from said pedestal and said projection.

74. The method of claim 71, further including the step of applying a layer of PTFE over at least said projection.

75. The method of claim 71, wherein said connection component includes a support layer supporting said at least one lead, and wherein said pedestal has a height approximately equal to or less than a thickness of said support layer.

76. A method of making a tool for use in making a connection component including at least one lead having a frangible portion, said method comprising the steps of providing a tool body and a backing plate, forming on said tool body at least one pedestal, and forming on a surface of said backing plate at least one projection, said projection conforming to the configuration of said frangible portion, wherein said tool body is formed from a material different from said pedestal and said projection.

77. The method of claim 76, wherein said projection is constructed of material selected from the group consisting of osmium, rhodium, ceramic material and hard anodized aluminum.

78. A method of making a tool for use in making a connection component including at least one lead having a frangible portion, said method comprising the steps of providing a tool body and a backing plate, forming on said tool body at least one pedestal, and forming on a surface of said backing plate at least one projection, said projection conforming to the configuration of said frangible portion, and applying a layer of PTFE over at least said projection.

79. A method of making a tool for use in making a connection component including at least one lead having a frangible portion, said method comprising the steps of providing a tool body and a backing plate, forming on said tool body at least one pedestal, and forming on a surface of said backing plate at least one projection, said projection conforming to the configuration of said frangible portion, wherein said connection component includes a support layer supporting said at least one lead, and wherein said pedestal has a height approximately equal to or less than a thickness of said support layer.

* * * * *

UNITED STATES PATENT AND TRADEMARK OFFICE
CERTIFICATE OF CORRECTION

PATENT NO. : 6,196,042 B1  
DATED : March 6, 2001  
INVENTOR(S) : Distefano et al.

Page 1 of 1

It is certified that error appears in the above-identified patent and that said Letters Patent is hereby corrected as shown below:

<u>Title page, in the Inventor Section,</u>
Line 1, "Disfefano" should read -- DiStefano --.

<u>Column 2,</u>
Line 13, "6,053, 837" should read -- now Patent No. 6,083,837 --.

<u>Column 5,</u>
Line 37, "loo" should read -- 100 --.
Line 65, "openings" should read -- Openings --.

<u>Column 9,</u>
Line 28, after "having" insert -- only --.
Line 29, cancel "only".

<u>Column 10,</u>
Line 1, "conforminq" should read -- conforming --.

Signed and Sealed this

Fourth Day of September, 2001

Attest:

NICHOLAS P. GODICI
*Attesting Officer*    *Acting Director of the United States Patent and Trademark Office*